United States Patent
Chien et al.

(10) Patent No.: US 8,551,829 B2
(45) Date of Patent: Oct. 8, 2013

(54) METHOD FOR MANUFACTURING MULTI-GATE TRANSISTOR DEVICE

(75) Inventors: Chin-Cheng Chien, Tainan County (TW); Chun-Yuan Wu, Yunlin County (TW); Chih-Chien Liu, Taipei (TW); Chin-Fu Lin, Tainan (TW); Teng-Chun Tsai, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 175 days.

(21) Appl. No.: 12/943,015

(22) Filed: Nov. 10, 2010

(65) Prior Publication Data

US 2012/0115284 A1    May 10, 2012

(51) Int. Cl.
  *H01L 21/00*  (2006.01)
  *H01L 21/84*  (2006.01)
  *H01L 21/70*  (2006.01)

(52) U.S. Cl.
  USPC .......................................... 438/157; 257/369

(58) Field of Classification Search
  None
  See application file for complete search history.

(56) References Cited

U.S. PATENT DOCUMENTS

| | | | |
|---|---|---|---|
| 6,921,963 B2 | 7/2005 | Krivokapic et al. | |
| 7,045,401 B2 * | 5/2006 | Lee et al. | 438/157 |
| 7,091,551 B1 | 8/2006 | Anderson et al. | |
| 7,531,437 B2 | 5/2009 | Brask et al. | |
| 2007/0069302 A1 * | 3/2007 | Jin et al. | 257/369 |
| 2009/0108291 A1 | 4/2009 | Cheng et al. | |
| 2010/0129994 A1 | 5/2010 | Awad et al. | |

\* cited by examiner

*Primary Examiner* — Fernando L Toledo
*Assistant Examiner* — Valerie N Newton
(74) *Attorney, Agent, or Firm* — Winston Hsu; Scott Margo

(57) ABSTRACT

A method for manufacturing a multi-gate transistor device includes providing a semiconductor substrate having a first patterned semiconductor layer formed thereon, sequentially forming a gate dielectric layer and a gate layer covering a portion of the first patterned semiconductor layer on the semiconductor substrate, removing a portion of the first patterned semiconductor layer to form a second patterned semiconductor layer, and performing a selective epitaxial growth process to form an epitaxial layer on a surface of the second patterned semiconductor layer.

18 Claims, 5 Drawing Sheets

METHOD FOR MANUFACTURING MULTI-GATE TRANSISTOR DEVICE

BACKGROUND OF THE INVENTION

1. Field of the Invention

The invention relates to a method for manufacturing a multi-gate transistor device, and more particularly, to a method for manufacturing a multi-gate transistor device having raised source/drain.

2. Description of the Prior Art

Conventional planar metal-oxide-semiconductor (MOS) transistor has difficulty when scaling to 65 nm and below. Therefore the non-planar transistor technology such as Fin Field effect transistor (FinFET) technology that allows smaller size and higher performance is developed to replace the planar MOS transistor.

Please refer to FIG. 1, which is a schematic drawing of a conventional FinFET device. As shown in FIG. 1, the conventional FinFET device 100 is formed by: firstly a single crystalline silicon layer of a silicon-on-insulator (SOI) substrate 102 is patterned to form a fin film (not shown) in the SOI substrate 102 by proper etching process. Then, a high-K insulating layer 104 covering the fin film is formed and followed by forming a gate 106 covering the high-K insulating layer 104 and the fin film. Next, ion implantation and anneal treatment are performed to form a source/drain 108 in the fin film not covered by the gate 106. Since the manufacturing processes of the FinFET device are easily integrated into the traditional logic device processes, it provides superior compatibility. Furthermore, due to the structural particularity of its three-dimensional structure, traditional shallow trench isolation (STI) is not required in FinFET technology. More important, since the FinFET device increases the overlapping area between the gate and the substrate, the channel region is more effectively controlled. This therefore reduces drain-induced barrier lowering (DIBL) effect and short channel effect. In addition, the channel region is longer under the same gate length, and thus the current between the source and the drain is increased.

It is well-known to those skilled in the art that since the source/drain 108 of the FinFET device 100 are still formed by ion implantation, it is unavoidable to damage the lattice of the fin film. State-of-the-art may repair this damage by providing high temperature in the following anneal process. However, the temperature sufficient to repair such damage caused by the ion implantation undesirably deteriorates the stability of the high-K insulating layer 104. In other words, due to the low thermal budget of the high-K insulating layer 104, damage caused by the ion implantation cannot be repaired. Consequently, a method that is capable of overcoming the above-mentioned unsatisfactorily dilemmatic problem is stilled in need.

SUMMARY OF THE INVENTION

According to a first aspect of the present invention, there is provided a method for manufacturing a multi-gate transistor device. The method includes providing a semiconductor substrate having a first patterned semiconductor layer formed thereon, sequentially forming a gate dielectric layer and a gate layer covering a portion of the first patterned semiconductor layer on the semiconductor substrate, removing a portion of the first patterned semiconductor layer to form a second patterned semiconductor layer, and performing a selective epitaxial growth (SEG) process to form an epitaxial layer on a surface of the second patterned semiconductor layer.

According to the method for manufacturing a multi-gate transistor device provided by the present invention, the epitaxial layer having dopants of a conductivity type is formed on the surface of the second patterned semiconductor layer by the SEG process, and serves as a raised source/drain of the multi-gate transistor device. Since the SEG process is introduced to replace the conventional ion implantation and anneal treatment in the present invention, the damage to the lattice of the second patterned semiconductor layer caused by the ion implantation and the adverse impact to the gate dielectric layer caused by the anneal treatment are both fundamentally avoided. Furthermore, by forming the epitaxial layer on the surface of the second patterned semiconductor layer, strain stress is provided to the channel region of the multi-gate transistor device more effectively. Accordingly, the mobility in the channel region is improved and the performance of the multi-gate transistor device is subsequently improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-6 are schematic drawings illustrating the method for manufacturing a multi-gate transistor device provided by a first preferred embodiment of the present invention, wherein FIG. 3 is a modification to the present invention;

DETAILED DESCRIPTION

Figure 2:
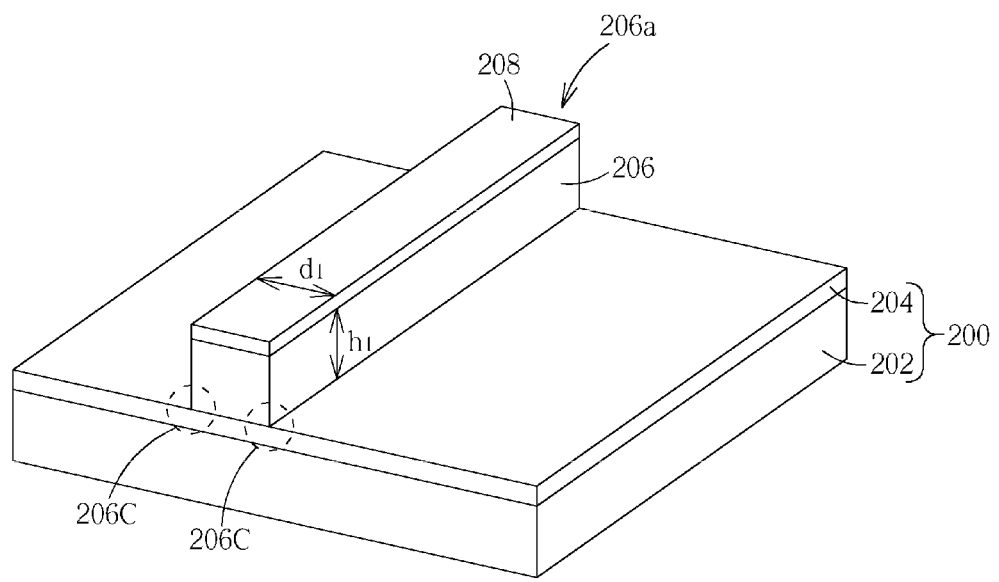

Please refer to FIGS. 2-7, which are schematic drawings illustrating the method for manufacturing a multi-gate transistor device provided by a first preferred embodiment of the present invention. As shown in FIG. 2, the preferred embodiment first provides a semiconductor substrate 200. The semiconductor substrate 200 can include a silicon-on-insulator (SOI) substrate. It is well-known to those skilled in the art that the SOI substrate upwardly includes a silicon substrate 202, a bottom oxide (BOX) layer 204, and a semiconductor layer (not shown) such as a single crystalline silicon layer formed on the BOX layer 204. However, for providing superior ground connection and thermal dissipation and for reducing interference and cost, the semiconductor substrate 200 provided by the preferred embodiment also can include a bulk silicon substrate.

Figure 3:
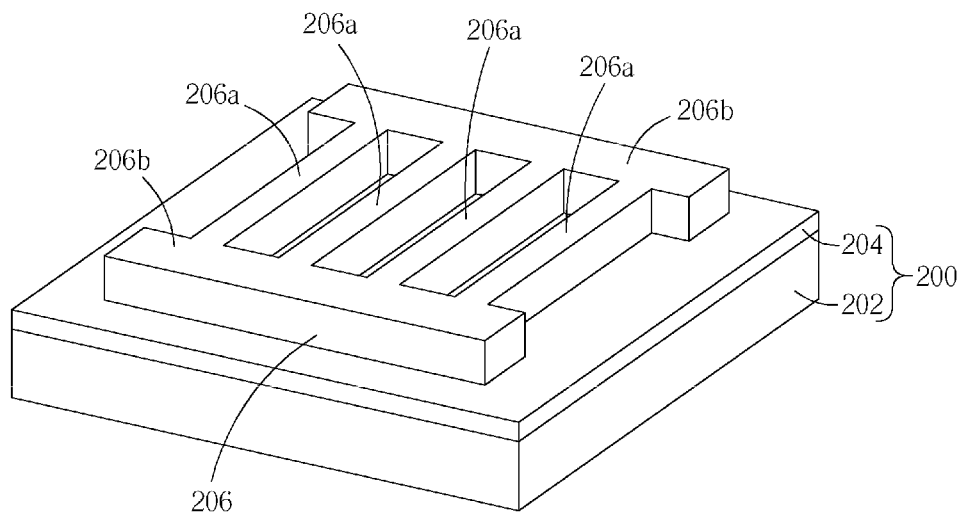

Please still refer to FIG. 2. Next, a patterned hard mask 208 for defining at least a fin of a multi-gate transistor device is formed on the semiconductor substrate 200 and followed by performing an etching process. Thus a portion of the semiconductor layer of the semiconductor substrate 200 is removed to form at least a first patterned semiconductor layer 206 on the semiconductor substrate 200. The first patterned semiconductor layer 206 comprises at least a fin 206a of a multi-gate transistor device as shown in FIG. 2. The fin 206a includes a width $d_1$ and a height $h_1$, and a ratio between the width $d_1$ and the height $h_1$ is about 1:1-1:1.5. Additionally, please refer to FIG. 3, which is a modification to the present invention. According to this modification, the first patterned semiconductor layer 206 includes a plurality of fins 206a and at least a landing pad 206b. The landing pad 206b is electrically connected to at least an end of each fin 206a as shown in FIG. 3. It is noteworthy that after forming the multi-gate transistor, a contact plug for the source/drain is formed on the landing pad 206b. Please refer to FIG. 2 again. When the first patterned semiconductor layer 206 is formed on the bulk silicon substrate, portions of the first patterned semiconductor layer 206 that contacting the semiconductor substrate 200, as shown in the circle designated by 206c, is selectively removed to form a recess (not shown) and selectively followed by forming a pad oxide layer in the recess. The above mentioned approach is introduced to reduce the contacting area between the first patterned semiconductor layer 206 and the bulk silicon substrate, and thus to reduce the leakage current.

Figure 4:
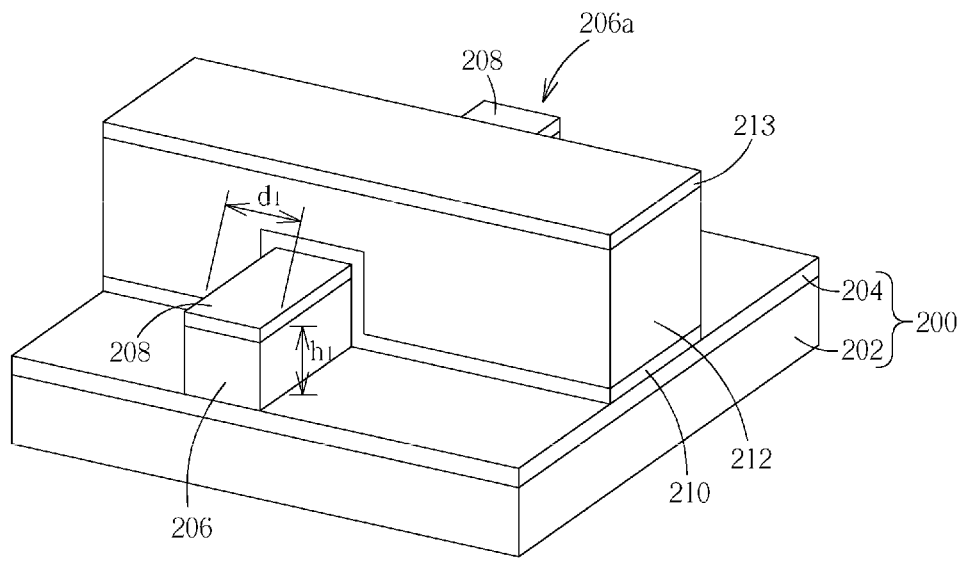

Please refer to FIG. 4. Next, a dielectric layer (not shown), a gate forming layer (not shown) and a patterned hard mask 213 are sequentially formed on the semiconductor substrate 200 and followed by patterning the dielectric layer and the gate forming layer through the patterned hard mask 213. Accordingly, a gate dielectric layer 210 and a gate layer 212 covering a portion of the first patterned semiconductor layer 206 is formed on the semiconductor substrate 200. As shown in FIG. 4, an extension direction of the gate dielectric layer 210 and the gate layer 212 is perpendicular to an extension direction of the fin 206a. And the gate dielectric layer 210 and the gate layer 212 covers a portion of a sidewall of the fin 206a. The gate dielectric layer 210 includes the conventional dielectric material such as silicon oxide (SiO), silicon nitride (SiN), or silicon oxynitride (SiON). In the preferred embodiment, the gate dielectric layer 210 can further include high-K dielectric material such as hafnium oxide (HfO), hafnium silicate (HfSiO), or metal oxide or metal silicate exemplarily of aluminum (Al), zirconium (Zr), lanthanum (La), but not limited to this. In addition, when the gate dielectric layer 210 of the preferred embodiment adopts the high-K dielectric material, the present invention can be further integrated to the metal gate process. Therefore control gate compatible to the high-K gate dielectric layer is obtained. Accordingly, the gate layer 212 can include different materials according to the gate-first or gate-last process. For example, when the preferred embodiment is integrated to the gate-first process, the gate layer 212 includes metal such as tantalum (Ta), titanium (Ti), ruthenium (Ru), molybdenum (Mo), alloys of the aforementioned metals, metal nitride such as tantalum nitride (TaN), titanium nitride (TiN), molybdenum nitride (MoN), or metal carbide such as tantalum carbide (TaC). It is noteworthy that the metals are chosen by providing proper work function to the multi-gate transistors of different conductivity types. And the gate layer 212 can be a single-layered or multi-layered structure. When the preferred embodiment is integrated to the gate-last process, the gate layer 212 serves as a dummy gate and includes semiconductor material such as polysilicon.

Please still refer to FIG. 4. In the preferred embodiment, a top of the first patterned semiconductor layer 206 is covered by the patterned hard mask 208, therefore no channel region is formed nearby. In other words, the channel region of the transistor in the preferred embodiment is formed in the fin 206a covered by only the gate layer 212 and the gate dielectric layer 210, that is formed in the two opposite sidewalls of the first patterned semiconductor layer 206. Accordingly, the multi-gate transistor device provided by the preferred embodiment is a double-gate transistor device.

Figure 5:
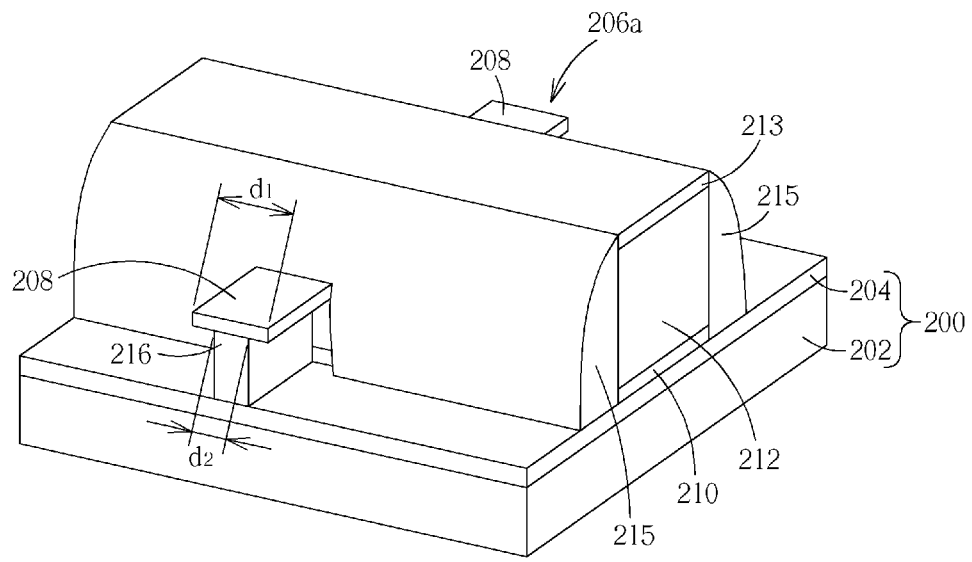

Please refer to FIG. 5. After forming the gate dielectric layer 210 and the gate layer 212, a tilted implantation as required is performed to form a source/drain extension regions 214 (shown in FIG. 7) in the first patterned semiconductor layer 206. And after forming the source/drain extension region 214, a spacer 215 is formed on sidewalls of the gate layer 212 and the gate dielectric layer 210. Additionally, the spacer 215 can be a single-layered or multi-layered structure.

Please still refer to FIG. 5. Then, a proper etching process is performed to remove a portion of the first patterned semiconductor layer 206. Consequently, a second patterned semiconductor layer 216 is formed. It is noteworthy that since the top of the first patterned semiconductor layer 206 is covered and protected by the patterned hard mask 208, only the sidewalls of the first patterned semiconductor layer 206 are removed. Therefore, the obtained second patterned semiconductor layer 216 as shown in FIG. 5 has a width $d_2$ smaller and the width $d_1$ of the patterned hard mask 208 and the first patterned semiconductor layer 206. For example, the width $d_2$ of the second patterned semiconductor layer 216 is smaller than the width $d_1$ of the first patterned semiconductor layer 206 covered by the gate dielectric layer 210 and the gate layer 212 in a ranged of 100~200 angstroms, but not limited to this.

Figure 6:
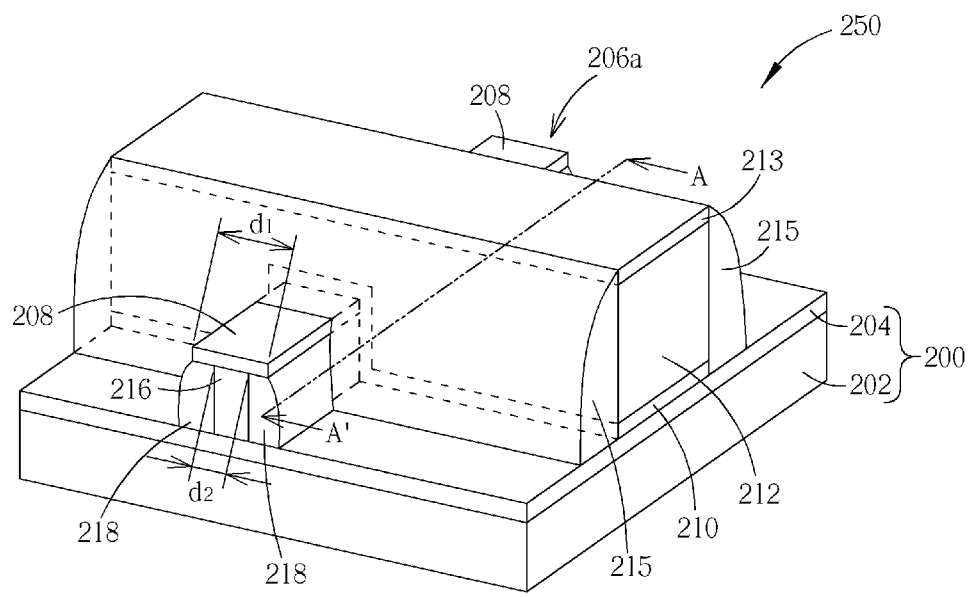

Please refer to FIG. 6. After forming the second patterned semiconductor layer 216, a selective epitaxial growth (SEG) process is performed to form an epitaxial layer 218 on a surface of the second patterned semiconductor layer 216 for serving as a source/drain of the multi-gate transistor device. Accordingly, a double-gate transistor device 250 provided by the first preferred embodiment is obtained. It is well-known that the epitaxial layer 218 is grown along the silicon surface during the SEG process, therefore the epitaxial layer 218 is formed only on the sidewalls of the second patterned semiconductor layer 216 in the preferred embodiment. Furthermore, materials having lattice constant different from the second patterned semiconductor layer 216 is introduced in the SEG process according to the requirement to conductivity types of the multi-gate transistor device. And dopants of a conductivity type can also be simultaneously introduced in the SEG process. In detail, when the double-gate transistor device 250 of the preferred embodiment is a PMOS transistor device, SiGe and p-type dopants such as boron (B) are introduced in the SEG process. Accordingly, the epitaxial layer 218 includes SiGeB while a concentration of Ge is about 30%-50%. When the double-gate transistor device 250 of the preferred embodiment is an NMOS transistor device, SiC and n-type dopants such as phosphorous (P) or Arsenic (As) are introduced in the SEG process. Accordingly, the epitaxial layer 218 includes SiCP while a concentration of C is lower than 3%. According to the preferred embodiment, the dopants of a conductivity type are simultaneously introduced in the SEG process, therefore ion implantation for forming the source/drain is no longer in need.

However, it is not limited to perform an ion implantation after forming the second patterned semiconductor layer 216 in the preferred embodiment. Consequently, a doped region (not shown) is formed in the second patterned semiconductor layer 216 and followed by performing the SEG process. Thus, only materials having lattice constant different from the second patterned semiconductor layer 216 is introduced in the SEG process. And the epitaxial layer 218 serves as the source/drain of the multi-gate transistor device.

Figure 7:
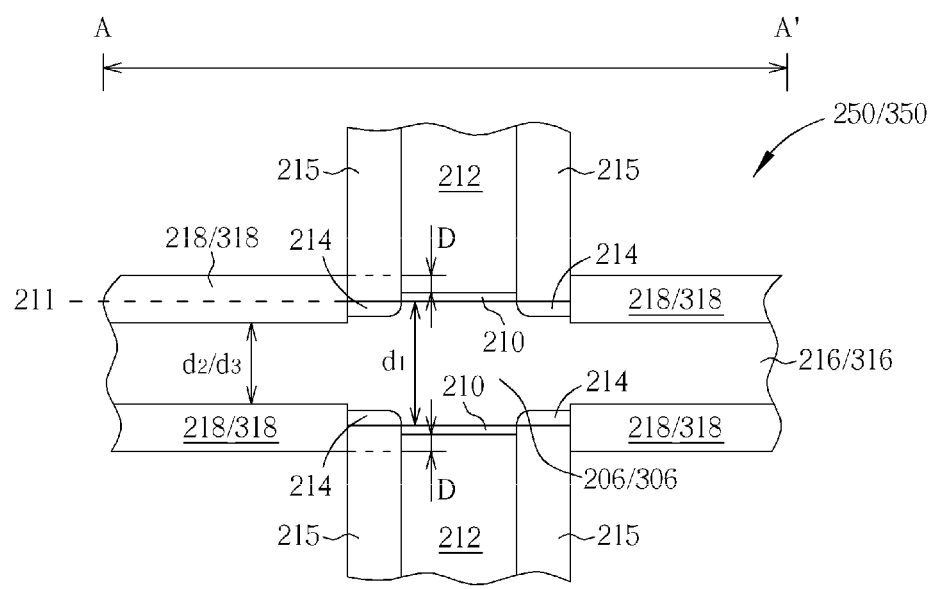
FIG. 7 is a cross-sectional view taken along line A-A' in FIG. 6 and FIG. 10.

Please still refer to FIG. 6 and FIG. 7, wherein FIG. 7 is a cross-sectional view taken along line A-A' in FIG. 6. It is noteworthy that for clarifying the height deviation between the epitaxial layer 218 and the gate dielectric layer 210, the gate dielectric layer 210 and the gate layer 212 covered by the spacer 215, and the first patterned semiconductor layer 206 are shown by dotted lines in FIG. 6. Furthermore, a surface of the first patterned semiconductor layer 206 is particularly shown by a dotted line 211 in FIG. 7 for serving as a comparison level for the gate dielectric layer 210, the second patterned semiconductor layer 216, and the epitaxial layer 218. As shown in FIG. 6 and FIG. 7, the epitaxial layer 218 is protruded from the second patterned semiconductor layer 216 according to the preferred embodiment. More important, a surface of the epitaxial layer 218 is higher than a surface of the gate dielectric layer 210. With the surface 211 of the first patterned semiconductor layer 206 serving as the comparison level, it is observed a height deviation D is existed between the surface of the epitaxial layer 218 and the surface of the gate dielectric layer 210, and the height deviation D is about 50-200 angstroms. In other words, the surface of the epitaxial layer 218 is about 50-200 angstroms higher than the surface of the gate dielectric layer 210. Moreover, the width $d_2$ of the second patterned semiconductor layer 216 is smaller than the width $d_1$ of the first patterned semiconductor layer 206. With the surface 211 of the first patterned semiconductor layer 206 serving as the comparison level, it is observed the epitaxial layer 218 is grown from the second patterned semiconductor layer 216 that has the surface lower than the first patterned semiconductor layer 206 and the gate dielectric layer 210. Therefore the epitaxial layer 218 provides strain stress to the channel region more effectively. Thus the carrier mobility is improved. In addition, since the epitaxial layer 218 is protruded from the second patterned semiconductor layer 216 and the surface of the epitaxial layer 218 is higher than the surface of the gate dielectric layer 210, the epitaxial layer 218 provided by the preferred embodiment serves as the raised the source/drain of the double-gate transistor 250 while the protruded epitaxial layer 218 provides buffers when forming silicide. Accordingly, problems that the silicide excessively consumes the epitaxial layer 218 and the second patterned semiconductor layer 216, even the first patterned semiconductor layer 206, and the adverse impact to the transistor device are avoided.

After forming the double-gate transistor device 250 of the preferred embodiment, an inter-layer dielectric (ILD) layer (not shown) is formed on the semiconductor substrate 200. As mentioned above, when the preferred embodiment is integrated to the gate-last metal gate process, the gate layer 212 serving as the dummy gate is removed after forming the ILD layer, and metals provides different work functions for NMOS or PMOS transistor and metals having good gap fill characteristics are provided to form the metal gates. In addition, the preferred embodiment also can be integrated to a high-K last process. Specifically speaking, the gate dielectric layer 210 is removed subsequent to the removal of the gate layer 212 and followed by forming another gate dielectric layer having high-K dielectric material. Since the abovementioned processes are well-known to those skilled in the art, the details are omitted herein in the interest of brevity.

According to the method for manufacturing a multi-gate transistor device provided by the first preferred embodiment, the epitaxial layer 218 having dopants of a conductivity type is formed on the surface of the second patterned semiconductor layer 216 by performing the SEG process. Thus the epitaxial layer 218 serves as the raised source/drain of the double-gate transistor device 250. Since the SEG process replaces the conventional ion implantation and anneal treatment according to the preferred embodiment, the damage to the lattice of the second patterned semiconductor layer 216 due to the ion implantation and the adverse impact to the stability of the gate dielectric layer 210 due to the anneal treatment are both avoided. Furthermore, since the epitaxial layer 218 is grown from the second patterned semiconductor layer 216 that has the surface lower than the first patterned semiconductor layer 206 and the gate dielectric layer 210, the epitaxial layer 218 provides strain stress to the channel region more effectively. Thus the carrier mobility in the channel region and the performance of the double-gate transistor device 250 are improved.

Figure 8:
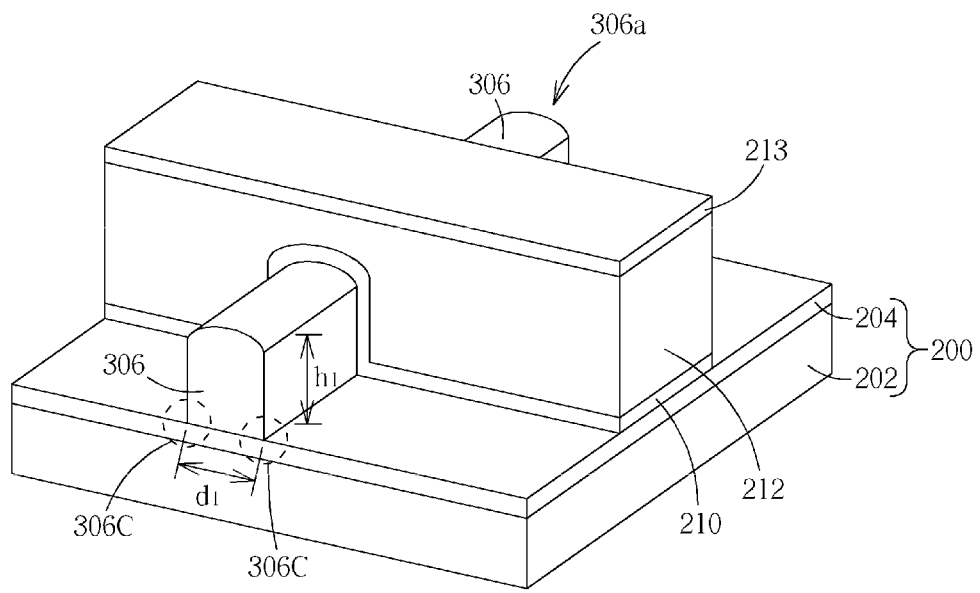
FIGS. 8-10 are schematic drawings illustrating the method for manufacturing a multi-gate transistor device provided by a second preferred embodiment of the present invention.
Figure 9:
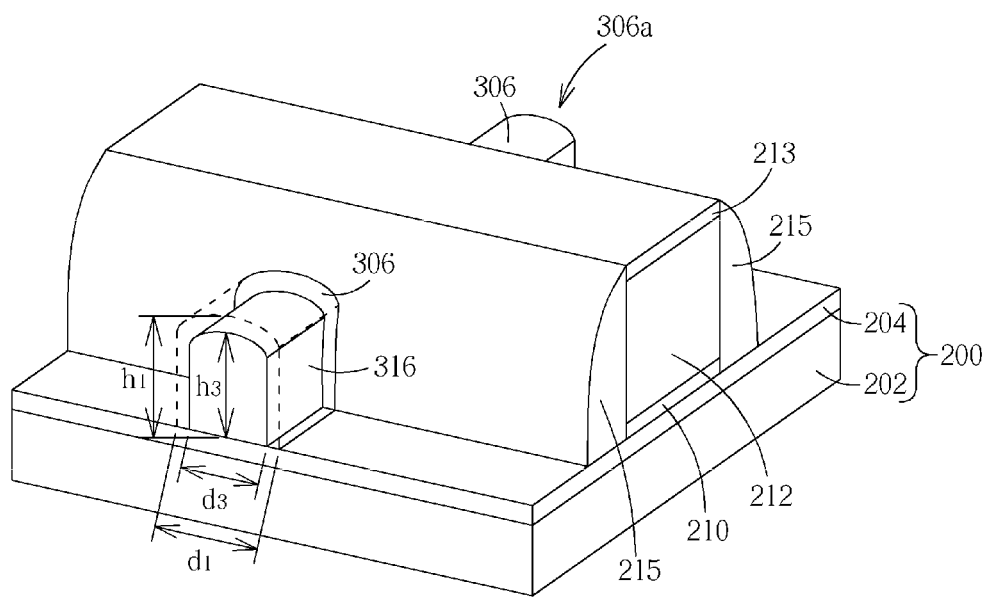
Figure 10:
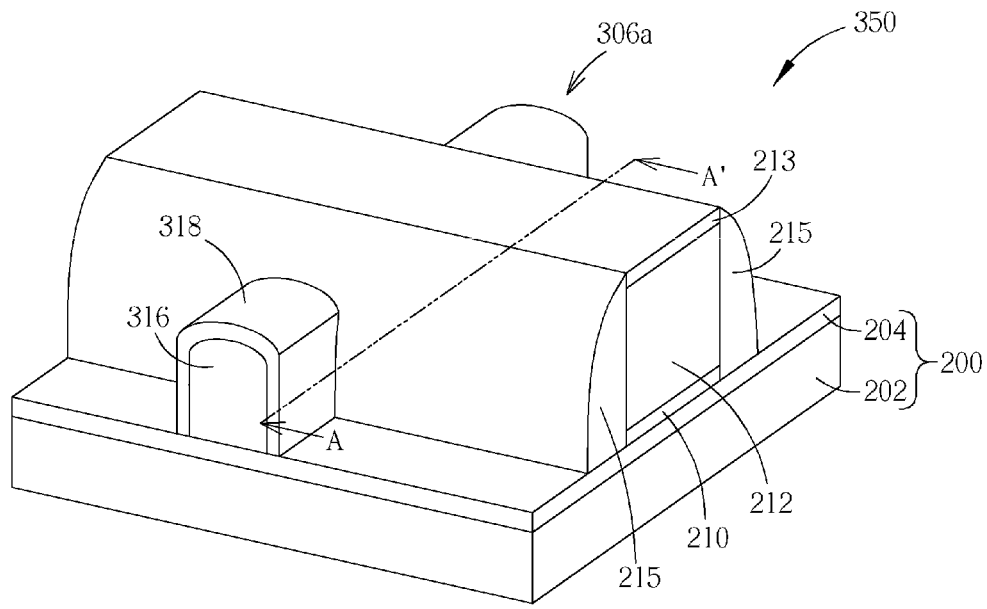

Please refer to FIGS. 8-10, which are schematic drawings illustrating the method for manufacturing a multi-gate transistor device provided by a second preferred embodiment of the present invention. It is noteworthy that in the second preferred embodiment, material choice of the elements and steps for forming the elements that are the same with the first preferred embodiment are omitted for the sake of simplicity, and the same elements in both the first and second preferred embodiments are designated by the same numerals. Please refer to FIG. 2. The second preferred embodiment first provides a semiconductor substrate 200 such as a SOI substrate. As mentioned above, the SOI substrate upwardly includes a silicon substrate 202, a BOX layer 204, and a semiconductor layer (not shown) such as a single-crystalline silicon layer formed on the BOX layer 204. For providing superior ground connection and thermal dissipation and for reducing cost and interference, the semiconductor substrate 200 of the preferred embodiment also can include a bulk silicon substrate. Then, a patterned hard mask 208 for defining at least a fin of a multi-gate transistor device is formed on the semiconductor substrate 200.

Please refer to FIG. 2 and FIG. 8. Then, an etching process is performed to remove the semiconductor layer of the semiconductor substrate 200 and to form at least a first patterned semiconductor layer 206 on the semiconductor substrate 200. The first patterned semiconductor layer 206 includes at least a fin 206a as shown in FIG. 2. According to the preferred embodiment, the first patterned semiconductor layer 206 also can include a plurality of fins 206a and at least a landing pad 206 electrically connected to at least an end of each fin 206a as shown in FIG. 3. After forming the first patterned semiconductor layer 206, the patterned hard mask 208 is removed as shown in FIG. 8. And a rounding step is performed to round a top portion of the first patterned semiconductor layer 206, particularly to round a top portion of the fin 206a. Accordingly, a first patterned semiconductor layer 306 having an arc top serving as a fin 306a of a multi-gate transistor device is obtained as shown in FIG. 8. As mentioned above, the fin 306a includes a width $d_1$ and height $h_1$, and a ratio between the width $d_1$ and the height $h_1$ is about 1:1-1:1.5. When the first patterned semiconductor layer 306 is formed on the bulk silicon substrate, portions of the first patterned semiconductor layer 306 contacting to the semiconductor substrate 200, as shown in the circle designated by 306c, is selectively removed to form a recess (not shown) and selectively followed by forming a pad oxide layer in the recess. The above mentioned approach is introduced to reduce the contacting area between the first patterned semiconductor layer 306 and the bulk silicon substrate, and thus to reduce the leakage current.

Figure 1:
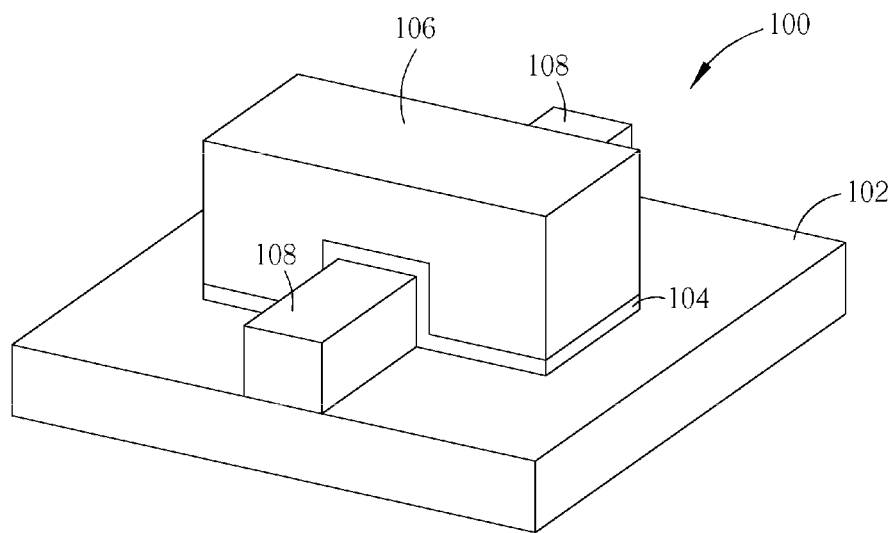
FIG. 1 is a schematic drawing of a conventional FinFET device.

Please still refer to FIG. 8. Next, a dielectric layer (not shown), a gate forming layer (not shown) and a pattern hard mask layer 213 are sequentially formed on the semiconductor substrate 200 and followed by performing a patterning process. Consequently, a gate dielectric layer 210 and a gate layer 212 covering a portion of the first patterned semiconductor layer 306 is formed on the semiconductor substrate 200. As shown in FIG. 8, an extension direction of the gate dielectric layer 210 and the gate layer 212 is perpendicular to an extension direction of the fin 306a. And the gate dielectric layer 210 and the gate layer 212 covers a portion of a sidewall of the fin 306a. It is noteworthy that since the patterned hard mask 208 is removed according to the preferred embodiment, channel regions are formed at where the fin 306a is covered by both of the gate layer 212 and the gate dielectric layer 210. That is, the channel regions are formed in the sidewalls and the arc top of the first patterned semiconductor layer 306. Accordingly, the multi-gate transistor device provided by the preferred embodiment is a tri-gate transistor device. Furthermore, since the top portion of the first patterned semiconductor layer 306 is rounded in the preferred embodiment, the tri-gate transistor device provided by the preferred embodiment avoids point discharge that often found in the convention FinFET transistor device having rectangular fins as shown in FIG. 1.

Please refer to FIG. 9. After forming the gate dielectric layer 210 and the gate layer 212, proper ion implantation is performed to form source/drain extension regions 214 in the first patterned semiconductor layer 306 (shown in FIG. 7). And after forming the source/drain extension regions 215, a spacer (also shown in FIG. 7) 215 is formed on sidewalls of the gate layer 212 and the gate dielectric layer 210. Additionally, the spacer 215 can be a single-layered or multi-layered structure. Then, a proper etching process is performed to remove a portion of the first patterned semiconductor layer 306 to form a second patterned semiconductor layer 316. The second patterned semiconductor layer 316 has a height $h_3$ and a width $d_3$. It is noteworthy that since the top and the sidewalls of the first patterned semiconductor layer 306 are etched in the etching process, both the height $h_3$ and the width $d_3$ of the obtained second patterned semiconductor layer 316 are smaller than the height $h_1$ and the width $d_1$ of first patterned semiconductor layer 306. For example, the height $h_3$ of the second patterned semiconductor layer 316 is smaller than the height $h_1$ of the first patterned semiconductor layer 306 in a ranged of 50-100 angstroms, but not limited to this; and the width $d_3$ of the second patterned semiconductor layer 316 is smaller than the width $d_1$ of the first patterned semiconductor layer 306 in a ranged of 100~200 angstroms, but not limited to this. Overall speaking, a size of the second patterned semiconductor layer 316 is smaller than a size of the first patterned semiconductor layer 306 that is covered by the gate dielectric layer 210 and the gate layer 212. As shown in FIG. 9, for clarifying the height and width deviations between the second patterned semiconductor layer 316 and the first patterned semiconductor layer 306, profiles of the first patterned semiconductor layer 306 is shown in dotted line.

Please refer to FIG. 10. After forming the second patterned semiconductor layer 316, an epitaxial layer 318 is formed on a surface of the second patterned semiconductor layer 316 by performing a SEG process. It is well-known that the epitaxial layer 318 is grown along the silicon surface in the SEG process, therefore the epitaxial layer 318 is formed on the sidewalls and the arc top of the second patterned semiconductor layer 316 in the preferred embodiment. The epitaxial layer 318 serves as a source/drain of the multi-gate transistor device and thus a tri-gate transistor device 350 is obtained. As mentioned above, materials having lattice constant different from the second patterned semiconductor layer 316 is introduced in the SEG process according to the requirement to the conductivity type of the multi-gate transistor device. And dopants of a conductivity type can also be simultaneously introduced in the SEG process. According to the preferred embodiment, the dopants of conductivity type are introduced in the SEG process, therefore ion implantation for forming the source/drain is no longer in need.

As mentioned above, it is not limited to perform an ion implantation after forming the second patterned semiconductor layer 316 in the preferred embodiment. Consequently, a doped region (not shown) is formed in the second patterned semiconductor layer 316 and followed by performing the SEG process. Thus, only materials having lattice constant different from the second patterned semiconductor layer 316 are introduced in the SEG process. And the epitaxial layer 318 serves as the source/drain of the multi-gate transistor device.

Please refer to both FIG. 10 and FIG. 7, wherein FIG. 7 is also a cross-sectional view taken along A-A' line in FIG. 10. It is noteworthy that for clarifying the height deviation between the epitaxial layer 318 and the gate dielectric layer 210, a surface of the first patterned semiconductor layer 306 is particularly shown by a dotted line 211 in FIG. 7 for serving as a comparison level for the gate dielectric layer 210, the second patterned semiconductor layer 316, and the epitaxial layer 318 in FIG. 10. In the preferred embodiment, the epitaxial layer 318 is protruded from the second patterned semiconductor layer 316. More important, a surface of the epitaxial layer 318 is higher than a surface of the gate dielectric layer 210. With the surface 211 of the first patterned semiconductor layer 306 serving as the comparison level, it is observed a height deviation D is existed between the surface of the epitaxial layer 318 and the surface of the gate dielectric layer 210, and the height deviation D is about 50-200 angstroms. In other words, the surface of the epitaxial layer 318 is about 50-200 angstroms higher than the surface of the gate dielectric layer 210. Moreover, the width $d_3$ of the second patterned semiconductor layer 316 is smaller than the width $d_1$ of the first patterned semiconductor layer 306. With the surface 211 of the first patterned semiconductor layer 306 serving as the comparison level, it is observed the epitaxial layer 318 is grown from the second patterned semiconductor layer 316 that has the surface lower than the first patterned semiconductor layer 306 and the gate dielectric layer 210. Therefore the epitaxial layer 318 provides strain stress to the channel region more effectively. Thus the carrier mobility is improved. In addition, since the epitaxial layer 318 is protruded from the second patterned semiconductor layer 316 and the surface of the epitaxial layer 318 is higher than the surface of the gate dielectric layer 210, the epitaxial layer 318 provided by the preferred embodiment serves as the raised the source/drain of the tri-gate transistor 350 while the protruded the epitaxial layer 318 provides buffers when forming silicide. Accordingly, problems that the silicide excessively consumes the epitaxial layer 318 and the second patterned semiconductor layer 316, even first patterned semiconductor layer 306 and the adverse impact to the transistor device are avoided.

As mentioned above, after forming the tri-gate transistor device 350 of the preferred embodiment, an ILD layer (not shown) is formed on the semiconductor substrate 200. And when the preferred embodiment is integrated to the gate-last metal gate process, the gate layer 212 serving as the dummy gate is removed after forming the ILD layer, and metals provides different work functions for NMOS or PMOS transistor and metals having good gap fill characteristics are provided to form the metal gates. In addition, the preferred embodiment also can be integrated to a high-K last process, that is to remove the gate dielectric layer 210 subsequent to the removal of the gate layer 212 and to form another gate dielectric layer having high-K dielectric material. Since the abovementioned processes are well-known to those skilled in the art, the details are omitted herein in the interest of brevity.

According to the method for manufacturing a multi-gate transistor device provided by the second preferred embodiment, the epitaxial layer 318 having dopants of a conductivity type is formed on the surface of the second patterned semiconductor layer 316 by performing the SEG process. Thus the epitaxial layer 318 serves as the raised source/drain of the tri-gate transistor device 350. Since the SEG process replaces the conventional ion implantation and anneal treatment according to the preferred embodiment, the damage to the lattice of the second patterned semiconductor layer 316 due to the ion implantation and the adverse impact to the stability of the gate dielectric layer 210 due to the anneal treatment are both avoided. Furthermore, since the epitaxial layer 318 is grown from the second patterned semiconductor layer 316 that has the surface lower than the first patterned semiconductor layer 306 and the gate dielectric layer 210, the epitaxial layer 318 provides strain stress to the channel region more effectively. Thus the carrier mobility and the performance of the tri-gate transistor device 350 are improved.

According to the method for manufacturing a multi-gate transistor device provided by the present invention, the epitaxial layer having dopants of a conductivity type is formed on the surface of the second patterned semiconductor layer by the SEG process, and serves as a raised source/drain. Since the SEG process is introduced to replace the conventional ion implantation and anneal treatment in the present invention, the damage to the lattice of the second patterned semiconductor layer caused by the ion implantation and the adverse impact to the gate dielectric layer caused by the anneal treatment are both fundamentally avoided. Furthermore, by forming the epitaxial layer on the surface of the second patterned semiconductor layer, strain stress is provided to the channel region of the multi-gate transistor device more effectively. Accordingly, the mobility in the channel region is improved and thus and the performance of the multi-gate transistor device is subsequently improved.

Those skilled in the art will readily observe that numerous modifications and alterations of the device and method may be made while retaining the teachings of the invention.

What is claimed is:

1. A method for manufacturing multi-gate transistor device comprising:
   providing a semiconductor substrate having a first patterned semiconductor layer formed thereon;
   sequentially forming a gate dielectric layer and a gate layer covering a portion of the first patterned semiconductor layer on the semiconductor substrate;
   removing a portion of the first patterned semiconductor layer not covered by the gate dielectric layer and the gate layer to form a second patterned semiconductor layer after forming the gate dielectric layer and the gate layer; and
   performing a selective epitaxial growth (SEG) process to form an epitaxial layer on a surface of the second patterned semiconductor layer.

2. The method for manufacturing multi-gate transistor device according to claim 1, wherein the semiconductor substrate comprises silicon-on-insulator (SOI) substrate or bulk silicon substrate.

3. The method for manufacturing multi-gate transistor device according to claim 1, wherein the gate dielectric layer comprises a high-K dielectric material.

4. The method for manufacturing multi-gate transistor device according to claim 1, wherein the step of forming the first patterned semiconductor layer further comprises forming a patterned hard mask on the semiconductor substrate and removing a portion of the semiconductor substrate through the patterned hard mask.

5. The method for manufacturing multi-gate transistor device according to claim 4, further comprising steps of removing the patterned hard mask and rounding the first patterned semiconductor layer.

6. The method for manufacturing multi-gate transistor device according to claim 5, wherein a height and a width of the second patterned semiconductor layer are both smaller than a height and a width of the first patterned semiconductor layer.

7. The method for manufacturing multi-gate transistor device according to claim 1, wherein a width of the second patterned semiconductor layer is smaller than a width of the first patterned semiconductor layer.

8. The method for manufacturing multi-gate transistor device according to claim 1, wherein the first patterned semiconductor layer comprises at least a fin.

9. The method for manufacturing multi-gate transistor device according to claim 1, wherein the first patterned semiconductor layer comprises at least a fin and a landing pad.

10. The method for manufacturing multi-gate transistor device according to claim 1, wherein the epitaxial layer protrudes from the second patterned semiconductor layer, and a surface of the epitaxial layer is higher than a surface of the gate dielectric layer.

11. The method for manufacturing multi-gate transistor device according to claim 10, wherein the surface of the epitaxial layer is about 50-200 angstroms higher than the surface of the gate dielectric layer.

12. The method for manufacturing multi-gate transistor device according to claim 1, wherein the epitaxial layer comprises dopants of a conductivity type.

13. The method for manufacturing multi-gate transistor device according to claim 12, wherein the epitaxial layer at least comprises SiGe and a p-type dopant.

14. The method for manufacturing multi-gate transistor device according to claim 13, wherein the p-type dopant comprises boron (B).

15. The method for manufacturing multi-gate transistor device according to claim 12, wherein the epitaxial layer at least comprises SiC and an n-type dopant.

16. The method for manufacturing multi-gate transistor device according to claim 15, wherein the n-type dopant comprises phosphorous (P) or Arsenic (As).

17. The method for manufacturing multi-gate transistor device according to claim 12, wherein the dopants are introduced in the SEG process.

18. The method for manufacturing multi-gate transistor device according to claim 12, further comprises a step of performing an ion implantation to implant the dopants into the second patterned semiconductor layer after forming the second patterned semiconductor layer.

* * * * *